United States Patent
Kim et al.

(10) Patent No.: US 9,252,343 B2
(45) Date of Patent: Feb. 2, 2016

(54) LED PACKAGE

(71) Applicant: SAMSUNG ELECTRONICS CO., LTD., Suwon-si, Gyeonggi-do (KR)

(72) Inventors: Kwon-Jin Kim, Hwaseong-si (KR); Hee-Dong Kim, Seoul (KR); Hee-Seok Park, Suwon-si (KR); Ji-Seok Wang, Suwon-si (KR); Yong-Kee Jo, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/521,103

(22) Filed: Oct. 22, 2014

(65) Prior Publication Data

US 2015/0263253 A1 Sep. 17, 2015

(30) Foreign Application Priority Data

Mar. 14, 2014 (KR) .................. 10-2014-0030478

(51) Int. Cl.
*H01L 33/00* (2010.01)
*H01L 33/60* (2010.01)
*H01L 27/15* (2006.01)
*H01L 33/50* (2010.01)

(52) U.S. Cl.
CPC ............... *H01L 33/60* (2013.01); *H01L 27/15* (2013.01); *H01L 33/50* (2013.01)

(58) Field of Classification Search
CPC . H01L 33/0075; H01L 33/0095; H01L 33/04; H01L 33/08; H01L 33/18; H01L 33/32; H01L 33/405; H01L 33/48; H01L 33/483; H01L 33/486; H01L 33/50; H01L 33/504; H01L 33/505; H01L 33/54; H01L 33/58; H01L 33/647
USPC .......................................................... 257/98
See application file for complete search history.

(56) References Cited

U.S. PATENT DOCUMENTS

| | | | | |
|---|---|---|---|---|
| 7,812,360 B2 * | 10/2010 | Yano | | 257/98 |
| 7,994,531 B2 * | 8/2011 | Lin et al. | | 257/98 |
| 2011/0254039 A1 | 10/2011 | Kim et al. | | |
| 2012/0007108 A1 * | 1/2012 | Kobayashi et al. | | 257/88 |
| 2012/0193647 A1 * | 8/2012 | Andrews | | 257/88 |
| 2013/0234274 A1 * | 9/2013 | Kam et al. | | 257/432 |
| 2013/0322067 A1 * | 12/2013 | Tien et al. | | 362/231 |
| 2014/0151726 A1 | 6/2014 | Maeda et al. | | |

FOREIGN PATENT DOCUMENTS

| | | |
|---|---|---|
| JP | 4221053 B1 | 11/2008 |
| JP | 2010-115860 A | 5/2010 |
| JP | 2011-228703 A | 11/2011 |
| JP | 2013-021248 A | 1/2013 |
| JP | 2013-153070 A | 8/2013 |

\* cited by examiner

Primary Examiner — Tod T Van Roy
Assistant Examiner — Vu A Vu
(74) *Attorney, Agent, or Firm* — McDermott Will & Emery LLP

(57) ABSTRACT

An LED package includes a package substrate, a first LED chip mounted on the package substrate, a first phosphor layer disposed on the first LED chip, a reflective layer configured to surround sides of the first LED chip and the first phosphor layer; and a mask disposed on the reflective layer and including a first opening portion which exposes a surface of the first phosphor layer.

20 Claims, 13 Drawing Sheets

LED PACKAGE

CROSS-REFERENCE TO RELATED APPLICATION

This application claims priority under 35 U.S.C. §119 to Korean Patent Application No. 10-2014-0030478 filed on Mar. 14, 2014, the disclosure of which is hereby incorporated by reference in its entirety.

BACKGROUND

1. Field of the Disclosure

The present disclosure relates to an LED package and a method of manufacturing the LED package.

2. Description of Related Art

As the performance of an LED light source improves, the application field is gradually expanding to an electronic device field from an information technology (IT) field. For example, development for an LED headlamp which adopts LED packages is actively being studied. The present disclosure proposes various LED packages which can improve the quality of light by blocking light spreading and by increasing a contrast ratio, and proposes methods of manufacturing the LED packages.

SUMMARY

Exemplary embodiments of the present disclosure include an LED package, a method of manufacturing the LED package, and a headlamp module having the LED package.

Technical objectives of the present disclosure are not limited to those discussed above; other objectives may become apparent to those of ordinary skill in the art based on the following descriptions.

In accordance with an aspect of the present disclosure, an LED package may include a package substrate, a first LED chip mounted on the package substrate, a first phosphor layer disposed on the first LED chip, a reflective layer configured to surround sides of the first LED chip and the first phosphor layer, and a mask disposed on the reflective layer and including a first opening portion which exposes a surface of the first phosphor layer.

In an embodiment of the present disclosure, the LED package may further include a second LED chip mounted on the package substrate to be spaced apart from the first LED chip, and a second phosphor layer disposed on the second LED chip, wherein the mask may further include a second opening portion which exposes a surface of the second phosphor layer.

In another embodiment, areas of the first opening portion and the second opening portion may be the same as areas of the first phosphor layer and the second phosphor layer, respectively.

In still another embodiment, the LED package may further include a second LED chip mounted on the package substrate to be spaced apart from the first LED chip, and a second phosphor layer disposed on the second LED chip, wherein the first opening portion exposes a surface of the first phosphor layer, a surface of the second phosphor layer and a surface of the reflective layer disposed between the first phosphor layer and the second phosphor layer.

In yet another embodiment, the LED package may further include a first metal wiring and a second metal wiring disposed on the package substrate, wherein the first LED chip is disposed on the second metal wiring.

In yet another embodiment, the LED package may further include a solder layer disposed on the second metal wiring.

In yet another embodiment, the first LED chip may include an electrode disposed on a lower surface thereof, and the electrode may be electrically connected to the second metal wiring through the solder layer.

In yet another embodiment, the first LED chip may include an electrode disposed on an upper surface thereof, and the electrode may be electrically connected to the first metal wiring through a wire.

In yet another embodiment, the electrode may be not covered by the first phosphor layer but may be covered by the reflective layer.

In yet another embodiment, the first phosphor layer may include a single layer having a substantially uniform thickness.

In yet another embodiment, the mask may include a metal plate having a black film formed by a black anodizing process.

In yet another embodiment, the LED package may further include an adhesive layer including silicon disposed between a surface of the reflective layer and the mask.

In accordance with another aspect of the present disclosure, an LED package may include a package substrate, a plurality of LED chips mounted on the package substrate to be arranged in a line, a plurality of phosphor layers disposed on respective LED chips to vertically overlap the LED chips, a reflective layer configured to surround sides of the LED chips and the phosphor layers, and a mask disposed on the reflective layer to expose surfaces of the phosphor layers, wherein the mask may include a first plate extending in a horizontal direction adjacent to first sides of the LED chips.

In an embodiment of the present disclosure, the mask may include a second plate extending in a horizontal direction adjacent to second sides of the LED chips opposite the first sides of the LED chips.

In another embodiment of the present disclosure, top surfaces of the phosphor layers and a top surface of the reflective layer may be coplanar, and the mask may protrude more than the top surface of the phosphor layers.

Detailed items of other exemplary embodiments of the present disclosure are included in the detailed descriptions and the accompanying drawings.

BRIEF DESCRIPTION OF THE DRAWINGS

The foregoing and other features and advantages of the present disclosure will be apparent from the more particular description of preferred, exemplary embodiments, as illustrated in the accompanying drawings in which like reference characters refer to the same parts throughout the different views. The drawings are not necessarily to scale, emphasis instead being placed upon illustrating the principles of the present disclosure. In the drawings.

DETAILED DESCRIPTION OF EXEMPLARY EMBODIMENTS

Figure 1A:
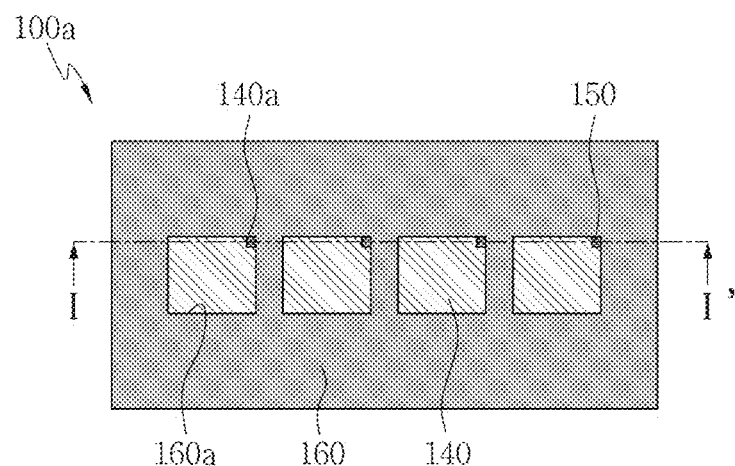
FIGS. 1A to 1F are top views and cross-sectional views conceptually illustrating LED packages in accordance with various exemplary embodiments of the present disclosure.

The present disclosure will now be described more fully hereinafter with reference to the accompanying drawings, in which exemplary embodiments of the present disclosure are shown. The present disclosure may, however, be embodied in different forms and should not be construed as limited to the embodiments set forth herein. Rather, these embodiments are provided so that this disclosure is thorough and complete and fully conveys the present disclosure to one having ordinary skill in the art.

The terminology used herein is for the purpose of describing particular embodiments only and is not intended to be limiting of the present disclosure. As used herein, the terms "a," "an," and "the," are intended to embody both a singular element and plural elements, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled with" another element or layer, it can be directly on, connected, or coupled to the other element or layer or intervening elements or layers may be present. In contrast, when an element is referred to as being "directly on," "directly connected to," or "directly coupled with" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Like numbers refer to like elements throughout the specification. Thus, the same or similar numbers may be described with reference to other drawings even if they are neither mentioned nor described in the corresponding drawing. Also, even elements that are not denoted by reference numbers may be described with reference to other drawings.

FIGS. 1A to 1F are top views and cross-sectional views conceptually illustrating LED packages in accordance with various, exemplary embodiments of the present disclosure.

Figure 1B:
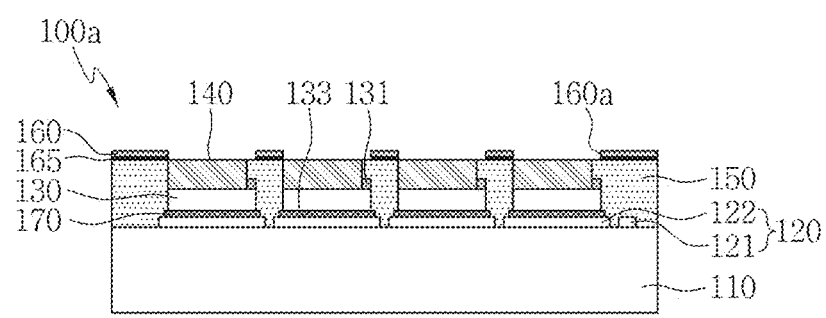

FIG. 1A is a top view of the LED package in accordance with an exemplary embodiment of the present disclosure, and FIG. 1B is a cross-sectional view taken along line I-I' in FIG. 1A.

Referring to FIGS. 1A and 1B, the LED package 100a according to an exemplary embodiment of the present disclosure may include a package substrate 110, metal wirings 120, LED chips 130, phosphor layers 140, a reflective layer 150, and a mask 160.

The package substrate 110 may include a ceramic material having a high thermal resistance and excellent thermal conductivity to improve heat dissipation characteristics of the LED package 100a. For example, the ceramic material may include aluminum oxide ($Al_2O_3$), aluminum nitride (AlN), etc.

The metal wirings 120 may be formed on the package substrate 110, and may electrically connect the LED package 100a to an external power source. The metal wirings 120 may include copper (Cu), nickel (Ni), gold (Au), or other metals. The metal wirings 120 may include a first metal wiring 121 and second metal wirings 122. The first metal wiring 121 may have a horizontal width smaller than each of the second metal wirings 122. The LED chips 130 may be disposed on corresponding second metal wirings 122.

The LED chips 130 may be mounted on the package substrate 110. There may be a plurality of the LED chips 130. The plurality of LED chips 130 may be arranged in a line to be spaced apart from each other on the package substrate 110. The LED chips 130 may generate blue light. The LED chips 130 may include first electrodes 131 and second electrodes 133. The first electrodes 131 and the second electrodes 133 may be disposed on top and bottom surfaces, respectively, of the LED chips 130. In another exemplary embodiment, both the first electrodes 131 and the second electrodes 133 may be disposed on the same surfaces of the LED chips 130.

When the first electrodes 131 and the second electrodes 133 are disposed on top and bottom surfaces, respectively, of the LED chips 130, the first electrodes 131 may be electrically connected to the first metal wiring 121 of the package substrate 110 using wires 180 (FIG. 5), and the second electrodes 133 may be electrically connected to the second metal wirings 122 of the package substrate 110 by solder layers 170. In this case, as the LED chips 130 may be attached on the second metal wirings 122 by the solder layers 170, the LED chips 130 may be mounted on the package substrate 110.

In another exemplary embodiment, when both the first electrodes 131 and the second electrodes 133 are disposed on the same surfaces of the LED chips 130, if the LED chips 130, in which the first electrodes 131 and the second electrodes 133 are disposed on a top surface thereof, are mounted on the package substrate 110, the first electrodes 131 and the second electrodes 133 may be electrically connected to the first metal wiring 121 and the second metal wirings 122 of the package substrate 110 using wires 180, respectively. The wires 180 may include copper (Cu), nickel (Ni), gold (Au), or other metals. In this case, the LED chips 130 may be to the package substrate 110 rather than the second metal wirings 122. For example, after a non-conductive adhesive material is interposed between a top surface of the package substrate 110 and bottom surfaces of the LED chips 130, the LED chips 130 may be mounted on the package substrate 110 by heating and curing.

In another exemplary embodiment, when the LED chips 130, in which the first electrodes 131 and the second electrodes 133 are disposed on a bottom surface thereof, are mounted on the package substrate 110, the first electrodes 131 and the second electrodes 133 may be electrically connected to the first metal wiring 121 and the second metal wirings 122 of the package substrate 110, respectively, by a conductive adhesive material. In this case, as the LED chips 130 are attached to the first metal wiring 121 and the second metal wirings 122 of the package substrate 110 by the conductive adhesive material, the LED chips 130 may be mounted on the package substrate 110.

In the exemplary embodiments of the present disclosure, descriptions will be based on a structure in which the first electrodes 131 and the second electrodes 133 are formed on the top and bottom surfaces, respectively, of the LED chips 130.

The phosphor layers 140 may be formed on top surfaces of the LED chips 130. The phosphor layers 140 may emit white light converted from blue light generated by the LED chips 130. The phosphor layer 140 may include a single layer having a substantially uniform thickness. For example, the phosphor layer 140 may include a film in which a mixture of a yellow phosphor material, an orange phosphor material, glass powder, and silicon is sintered at a high temperature. In another exemplary embodiment, the phosphor layer 140 may include a film in which a mixture of the yellow phosphor material, the glass powder, and silicon is sintered at a high temperature. The phosphor layers 140 may have substantially the same areas as upper surfaces of the LED chips 130. The phosphor layers 140 may include a first phosphor layer disposed on the first LED chip and a second phosphor layer disposed on the second LED chip.

When one of the first electrodes 131 and the second electrodes 133, for example, the first electrodes 131, are disposed respectively on the top surfaces of the LED chips 130, the phosphor layers 140 may include one electrode exposed portion 140a to expose the first electrodes 131. By the electrode exposed portion 140a, the first electrodes 131 may not be covered by the phosphor layers 140 but covered by the reflective layer 150. In another exemplary embodiment, when both the first electrodes 131 and the second electrodes 133 are disposed on the top surfaces of the LED chips 130, the phosphor layers 140 may include two electrode exposed portions 140a to expose each of the first electrodes 131 and the second electrodes 133.

Sides of the LED chips 130 and the phosphor layers 140 may be surrounded by the reflective layer 150. The reflective layer 150 may reflect light emitted from the sides of the LED chips 130 in side directions of the light LED chips 130 so that the light may not be emitted to the outside from portions other than the phosphor layers 140. A top surface of the reflective layer 150 may be coplanar with a top surface of the phosphor layers 140. The reflective layer 150 may include a reflective material and a base resin. For example, the reflective material may include a metal oxide having white color such as titanium dioxide ($TiO_2$). The base resin may include silicon.

The mask 160 may be formed on a top surface of the reflective layer 150 to expose the phosphor layers 140. The mask 160 may be formed on the entire top surface of the reflective layer 150.

In this case, the mask 160 may include an opening portion 160a through which the phosphor layers 140 are exposed. When there are plural LED chips 130, the mask 160 may include a plurality of opening portions 160a formed at locations corresponding to each of the plurality of LED chips 130 and configured to expose each of the plurality of phosphor layers 140. In this case, the plurality of opening portions 160a may have substantially the same areas as the corresponding upper surfaces of the phosphor layers 140. Alternatively, the plurality of opening portions 160a may have areas greater than the corresponding upper surfaces of the phosphor layers 140.

Figure 1C:
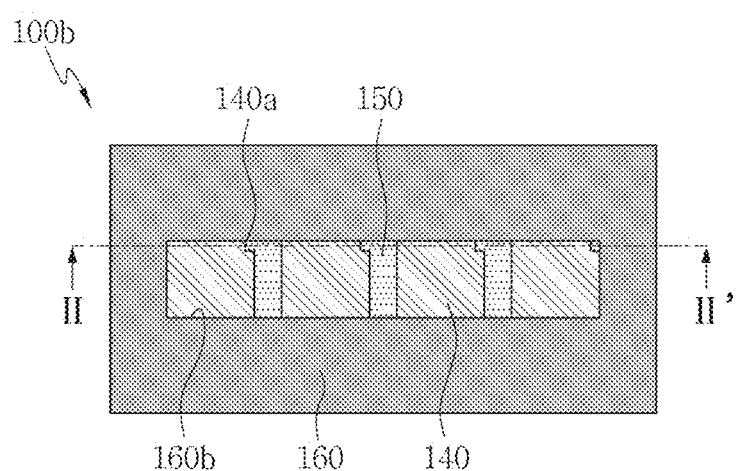
Figure 1D:
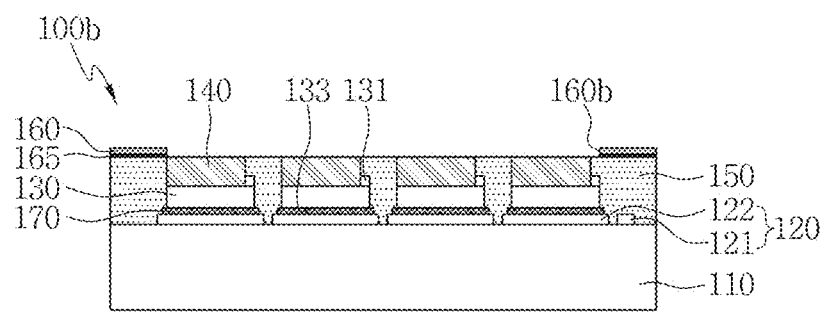

FIG. 1C is a top view of the LED package in accordance with another exemplary embodiment of the present disclosure, and FIG. 1D is a cross-sectional view taken along line II-II' in FIG. 1C.

Referring to FIGS. 1C and 1D, when there are plural LED chips 130, the mask 160 may include one opening portion 160b which exposes all of each phosphor layer 140 formed on the top surfaces of the plurality of LED chips 130. In this case, the area of the one opening portion 160b may be substantially the same as the sum of the areas of the plurality of phosphor layers 140 and the areas of reflective layers 150 formed between the plurality of phosphor layers 140. In another exemplary embodiment, the area of the one opening portion 160b may be greater than the sum of the areas of the plurality of phosphor layers 140 and the areas of the reflective layers 150 formed between the plurality of phosphor layers 140. The mask 160 of the LED package 100b according to this exemplary embodiment of the present disclosure may be easily aligned when forming the opening portion and attaching the mask 160 on the top surface of the reflective layer 150.

Figure 1E:
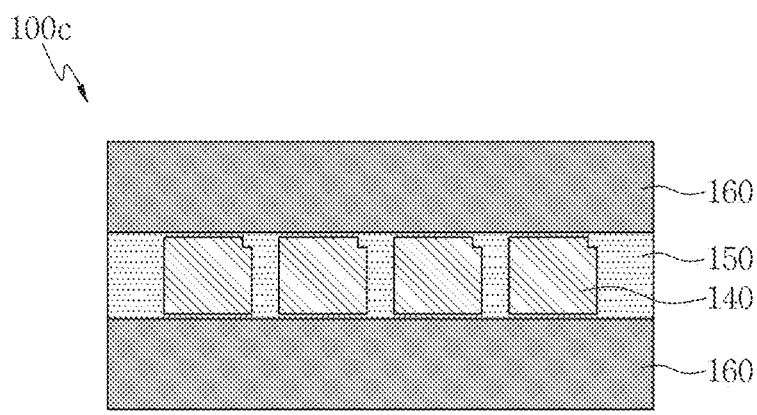
Figure 1F:
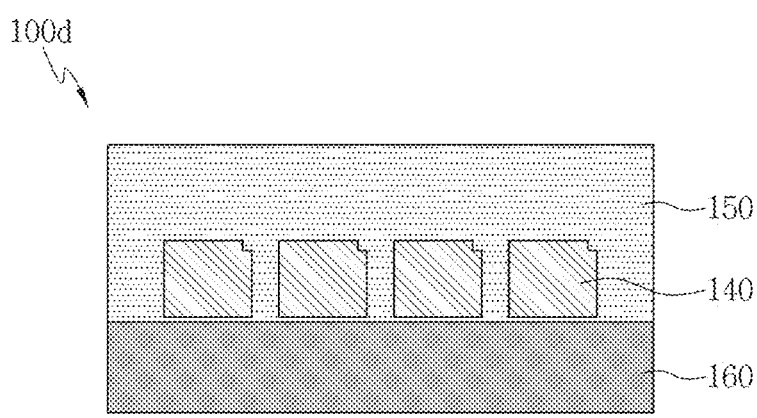

FIGS. 1E and 1F are top views of the LED package in accordance with another exemplary embodiment of the present disclosure.

Referring to FIGS. 1E and 1F, the mask 160 may be formed to expose the phosphor layers 140 on a part of the top of the reflective layer 150. For example, the mask 160 may be formed to extend adjacently to one side or both sides of the LED chips 130 or the phosphor layers 140 in a horizontal direction along a line formed by the disposition of the plurality of phosphor layers 140 on a part of the top of the reflective layer 150. In this exemplary embodiment of the present disclosure, the tops of the phosphor layers 140 and the top of the reflective layer 150 may include a coplanar surface, and the mask 160 may protrude more than the tops of the phosphor layers 140. Since the masks 160 of the LED packages 100c and 100d according to this exemplary embodiment of the present disclosure may not need to form the opening portion, the manufacturing process therefore can be simplified, and the masks can easily be attached to the top of the reflective layer 150.

The mask 160 may include a metal plate in which a black film is formed on the surface thereof. The metal may include aluminum (Al).

The LED package 100a according to an exemplary embodiment of the present disclosure may further include an adhesive layer 165 formed between the bottom of the mask 160 and the top of the reflective layer 150. The adhesive layer 165 may include silicon.

FIGS. 2A to 12B are top views for describing a method of manufacturing a LED package in accordance with an exemplary embodiment of the present disclosure and cross-sectional views taken along lines III-III', IV-IV', V-V', VI-VI', VII-VII', VIII-VIII', and IX-IX'.

Figure 2A:
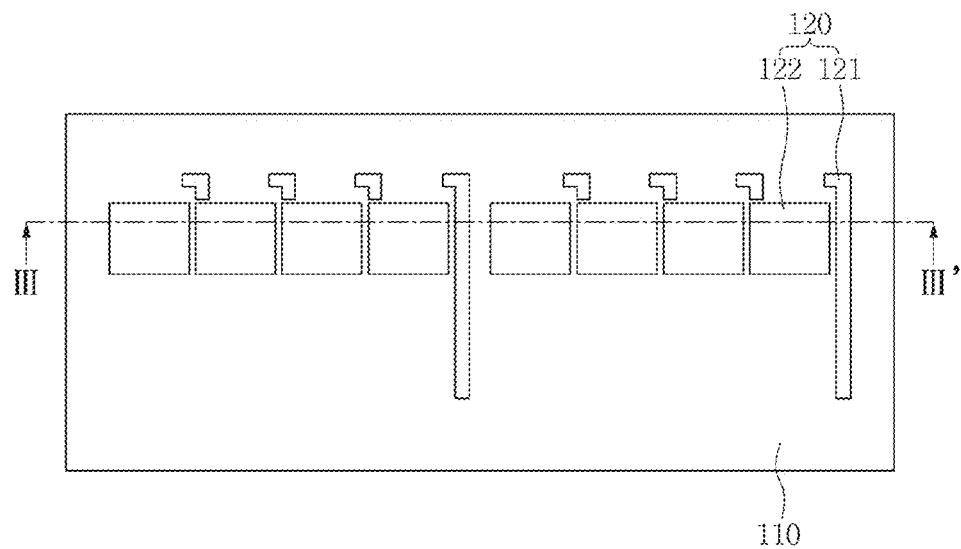
FIGS. 2A to 12B are top views for describing a method of manufacturing a LED package in accordance with an exemplary embodiment of the present disclosure and cross-sectional views taken along lines III-III', IV-IV', V-V', VI-VI', VII-VII', VIII-VIII', and IX-IX'.
Figure 2B:
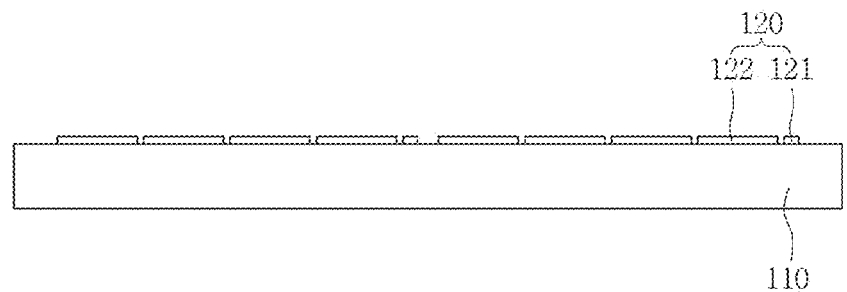

Referring to FIGS. 2A and 2B, the method of manufacturing the LED package according to an exemplary embodiment of the present disclosure may include forming metal wirings 120 on a package substrate 110. The package substrate 110 may include a ceramic material. For example, the ceramic material may include aluminum oxide ($Al_2O_3$), aluminum nitride (AlN), etc. The metal wirings 120 may include first metal wirings 121 and second metal wirings 122. Each of the first metal wirings 121 may be disposed adjacent to one of the second metal wirings 122, and have a horizontal width smaller than the second metal wiring 122. The metal wirings 120 may include copper (Cu), nickel (Ni), gold (Au), or other metals.

Figure 3:
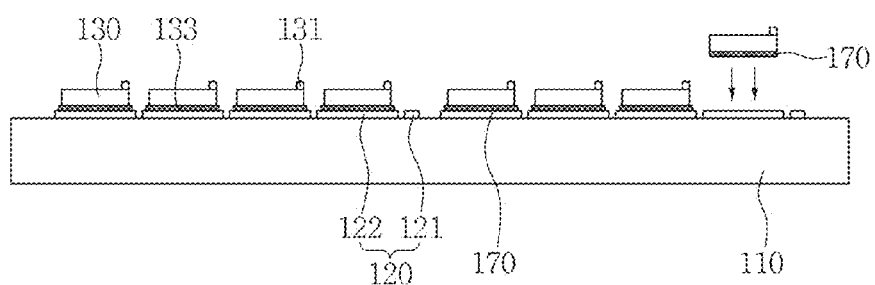
Figure 4A:
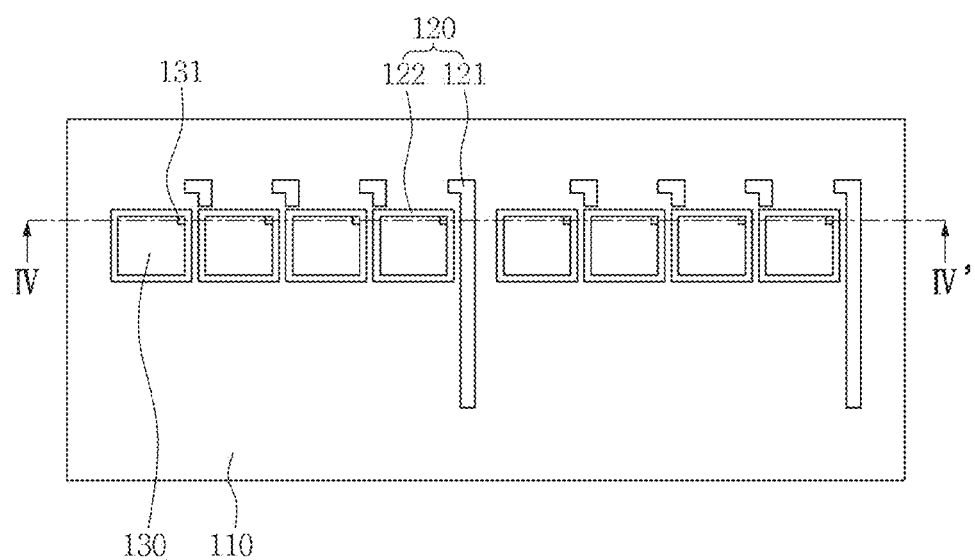
Figure 4B:
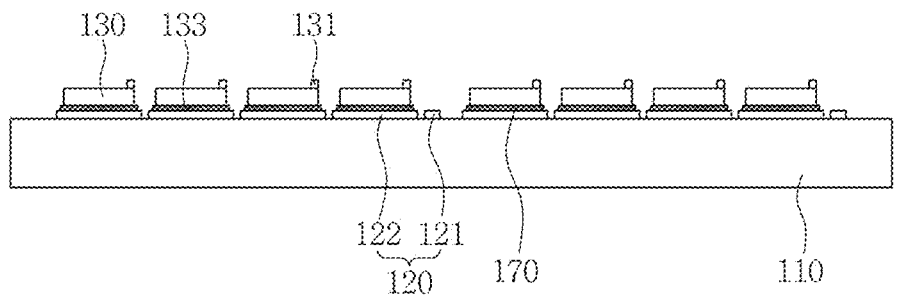

Referring to FIGS. 3, 4A, and 4B, the method may include mounting the LED chips 130 on the second metal wirings 122 formed on the package substrate 110. The process may be performed at a high temperature environment of 300° C. or more.

The LED chips 130 may generate blue light. The LED chips 130 may include first electrodes 131 and second electrodes 133. The first electrodes 131 and the second electrodes 133 may be disposed on the top and bottom surfaces, respectively, of the LED chips 130.

The LED chips 130 may include solder layers 170 formed on the second electrodes 133. For example, the solder layers 170 may include solder thin films. The solder layers 170 may include gold-tin (AuSn) alloy. The solder layers 170 may be formed by depositing the AuSn alloy on the second electrodes 133. For example, a method of the deposition may include a sputtering method.

In an exemplary embodiment of the present disclosure, when the process may be performed in a high temperature environment of about 300° C. and the LED chips 130 may be mounted on the second metal wirings 122 formed on the package substrate 110 wherein the solder layers 170 abut the second metal wirings 122, the solder layers 170 heated in the high temperature environment melt so that the LED chips 130 are bonded onto the second metal wirings 122.

Figure 5:
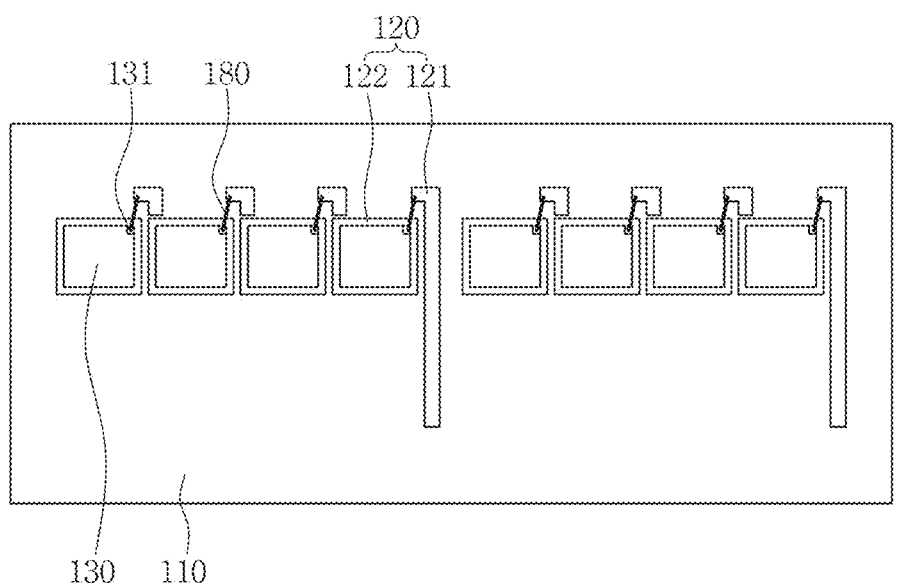

Referring to FIG. 5, the method may include electrically connecting the first electrodes 131 of the LED chips 130 to the first metal wirings 121. For example, the first electrodes 131 may be electrically connected to the first metal wirings 121 by performing a wire bonding process using wires 180. The wires 180 may include copper (Cu), nickel (Ni), gold (Au), or other metals.

Figure 6A:
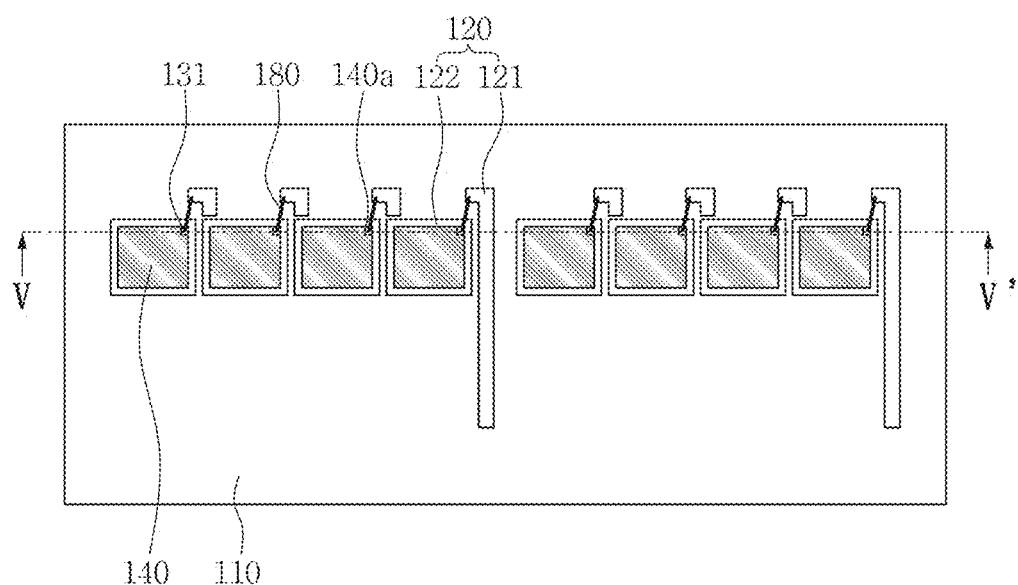
Figure 6B:
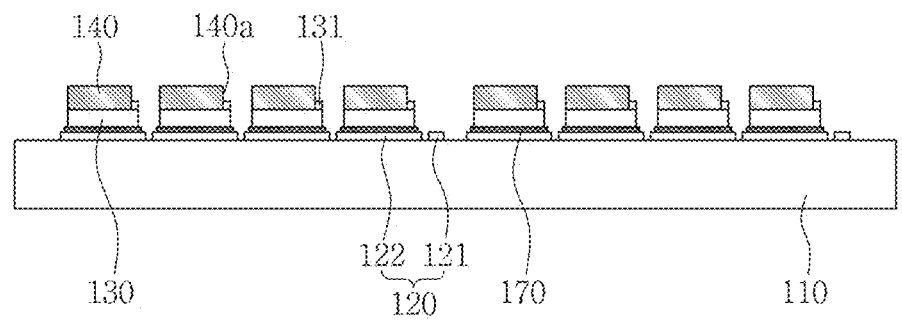

Referring to FIGS. 6A and 6B, the method may include forming phosphor layers 140 on the top surfaces of the LED chips 130. The phosphor layers 140 may emit white light, converted from blue light generated by the LED chips 130, to the outside. Each phosphor layer 140 may include a single layer having a substantially uniform thickness. For example, the phosphor layer 140 may include a film in which a mixture of yellow phosphor material, orange phosphor material, glass powder and silicon is sintered at a high temperature. In another exemplary embodiment, the phosphor layer 140 may include a film in which a mixture of the yellow phosphor material, the glass powder and silicon is sintered at a high temperature.

The phosphor layers 140 may be formed to have substantially the same areas as the upper surfaces of the LED chips 130. The phosphor layers 140 may include electrode exposed portions 140a which expose the corresponding first electrodes 131. For example, the electrode exposed portions 140a may be formed by a surface treatment process such as sand blasting.

The method according to an exemplary embodiment of the present disclosure may further include coating an adhesive material on the tops of the LED chips 130 before forming the phosphor layers 140 on the tops of the LED chips 130. The adhesive material may include silicon.

The forming of the phosphor layers 140 according to an exemplary embodiment of the present disclosure may include coating the adhesive materials on the tops of the LED chips 130, stacking the phosphor layers 140, in which the electrode exposed portions 140a are formed, on the tops of the LED chips 130, and heating and curing the adhesive materials at a predetermined temperature.

Figure 7A:
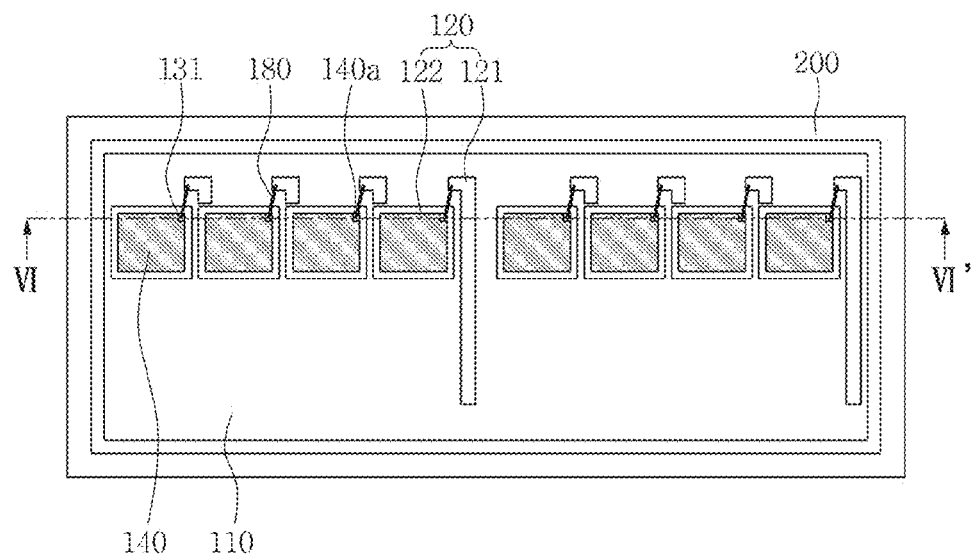
Figure 7B:
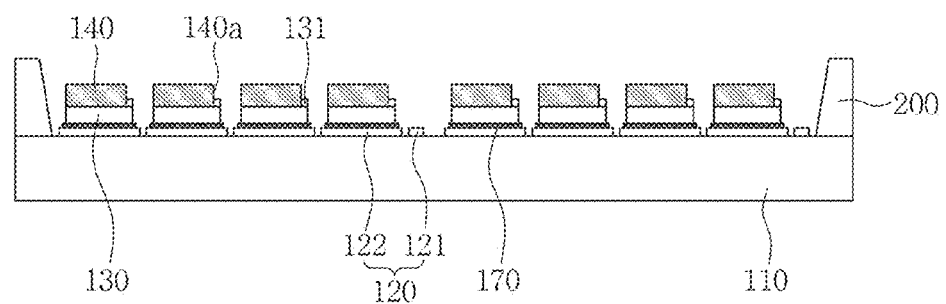

Referring to FIGS. 7A and 7B, the method may include forming a dam 200 on the edges of the package substrate 110. For example, the dam 200 may be formed by coating a resin material along the edges of the package substrate 110 using a dispenser. The resin material may be formed of a buffer material. Accordingly, when ceramic material is used for the package substrate 110 as described above, and the package substrate 110 expands and contracts by heating and cooling while manufacturing the LED package, the dam 200 structure may be modified corresponding to the expansion and contraction, thereby effectively preventing warping of the package substrate 110. Accordingly, ceramic material having high thermal resistance and excellent thermal conductivity can be used for the package substrate 110, thereby improving heat dissipation characteristics of the LED package.

Figure 8:
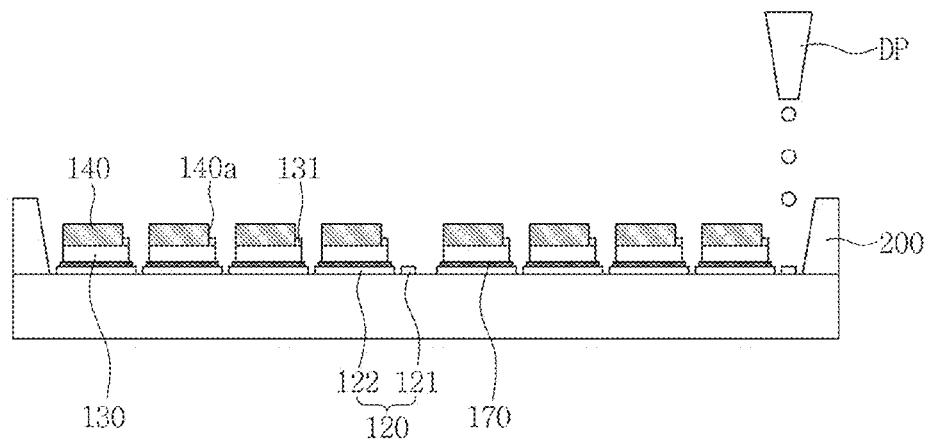
Figure 9A:
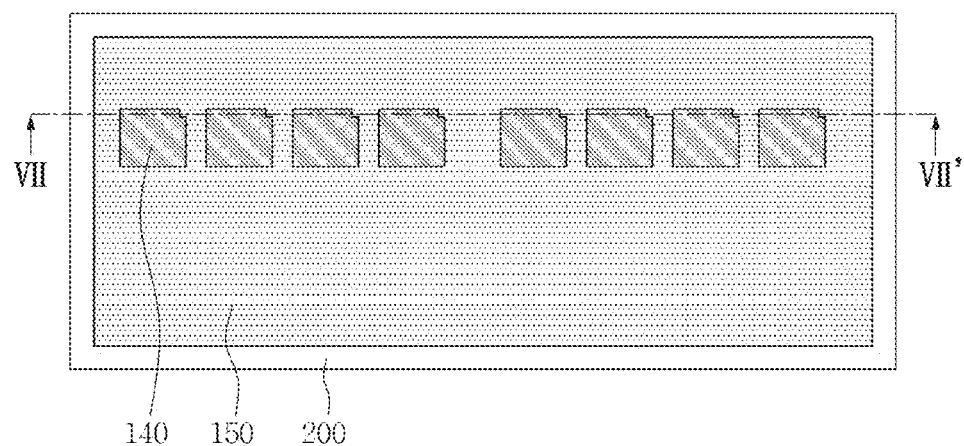
Figure 9B:
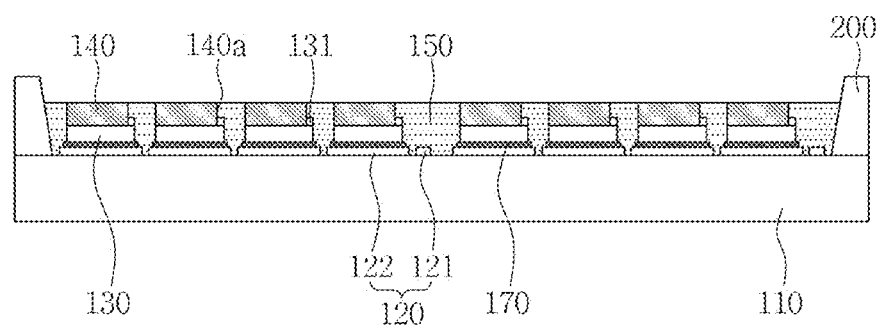

Referring to FIGS. 8, 9A, and 9B, the method may include forming a reflective layer 150, which surrounds the sides of the LED chips 130 and the phosphor layers 140, on the package substrate 110. The reflective layer 150 may reflect light emitted from the sides of the LED chips 130 to side directions of the LED chips 130, so as to emit light to the outside through only the phosphor layers 140 formed on the tops of the LED chips 130. Accordingly, since the reflective layer 150 may suppress a light spreading phenomenon by blocking light which spreads to the sides of the LED chips 130 and is emitted therefrom, the quality of light can be improved.

A top surface of the reflective layer 150 may be coplanar with top surfaces of the phosphor layers 140. The reflective layer 150 may include a reflective material and a base resin. For example, the reflective material may include a metal oxide having a white color such as titanium dioxide ($TiO_2$). The base resin may include silicon.

For example, the reflective layer 150 may be formed by heating at a predetermined temperature for a certain time after filling in spaces in a vicinity of the LED chips 130 with a mixture of the reflective material and the base resin using a dispenser (DP). For example, the reflective layer 150 may be formed by heating at a temperature of 150° C. or more for 1 hour or more. In this case, the reflective layer 150 may be formed by easily filling a cavity, defined in part by the dam 200 formed on the edges of the package substrate 110, with the mixture of the reflective material and the base resin by the above-described process.

Figure 10:
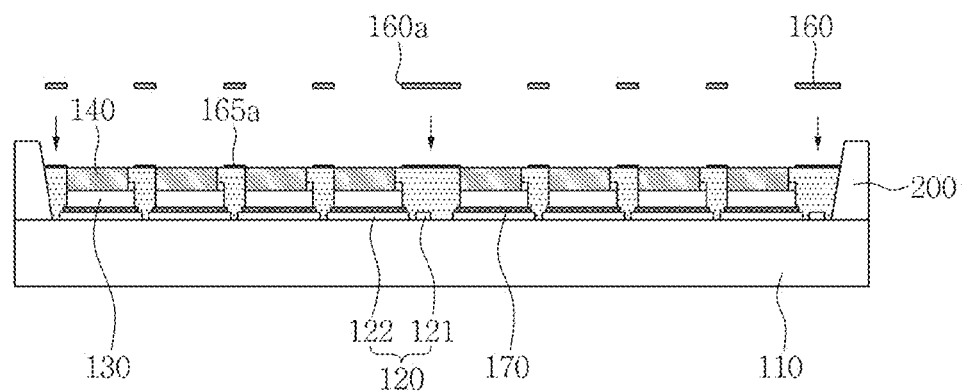
Figure 11A:
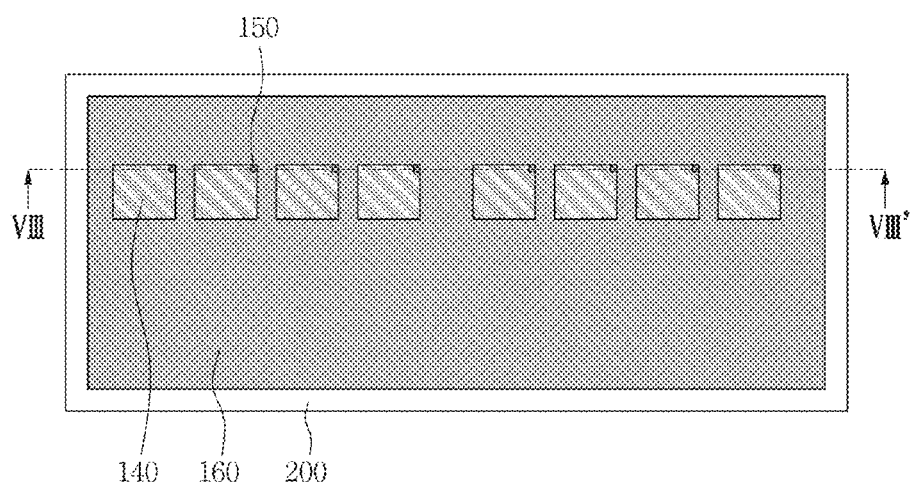
Figure 11B:
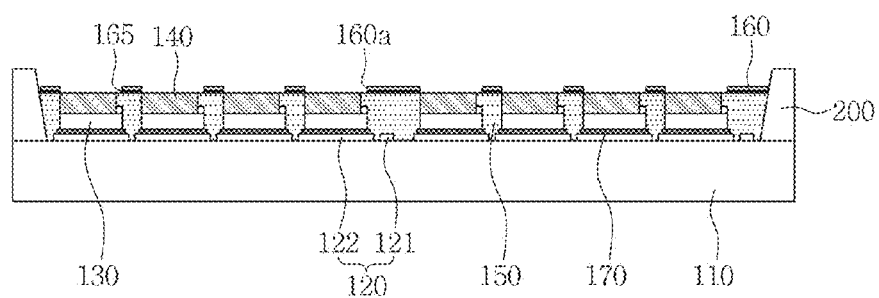

Referring to FIGS. 10, 11A, and 11B, the method may include forming a mask 160, which exposes the phosphor layers 140, on the reflective layer 150. The mask 160 may be formed to expose only the phosphor layers 140 in the entire top surface of the reflective layer 150.

In this case, the mask 160 may include an opening portion 160a which exposes a corresponding phosphor layer 140. When there are plural LED chips 130, the mask 160 may include a plurality of opening portions 160a formed at locations corresponding to each of the plurality of LED chips 130 and configured to expose each of the corresponding plurality of phosphor layers 140. The plurality of opening portions 160a may be formed to have substantially the same areas as the upper surfaces of the phosphor layers 140, respectively. In another exemplary embodiment, referring again to FIGS. 1C and 1D, when there are plural LED chips 130, the mask 160 may include one opening portion 160b which exposes all of the plurality of phosphor layers 140.

As described above, when the mask 160 includes the opening portions which expose the phosphor layers 140, the mask 160 may be manufactured by processing windows corresponding to the opening portions on a metal plate, and performing a surface treatment process on the metal plate in which the windows are processed.

For example, the metal plate may include an aluminum (Al) plate. The windows may be processed using a laser. The surface processing process may include a black anodizing process. As the black anodizing process is performed, a black film may be formed on the surface of the mask 160. As described above, since the mask 160 in which a black film is formed on the surface thereof is attached on the top of the reflective layer 150, the mask 160 may block light from the outside to the reflective layer 150 and light from the reflective layer 150 to the outside.

In another exemplary embodiment, referring again to FIGS. 1E and 1F, the mask 160 may not form plural opening portions which expose the phosphor layers 140, and may instead be formed as a plate on a part of the top of the reflective layer 150. In this case, the mask 160 may be manufactured by performing a black anodizing process on an aluminum (Al) plate in which windows corresponding to the opening portions which expose the phosphor layers 140 are not processed.

The method according to an exemplary embodiment of the present disclosure may further include coating an adhesive material 165a on the reflective layer 150 before attaching the mask 160 to the reflective layer 150. The adhesive material 165a may be coated on the reflective layer 150 using a dispenser. The adhesive material 165a may include silicon.

When the mask 160 is formed to expose only the phosphor layers 140 on an entire top surface of the reflective layer 150, the adhesive material 165a may be coated on the entire top surface of the reflective layer 150. In another exemplary embodiment, when the mask 160 is formed on a part of the top of the reflective layer 150, the adhesive material 165a may be coated on only portions in which the mask 160 may be attached to the top of the reflective layer 150.

The method of forming the mask 160 according to an exemplary embodiment of the present disclosure may include coating the adhesive material 165a on the reflective layer 150 using a dispenser, stacking the mask 160 on the reflective layer 150, and curing the adhesive material 165a by performing a heating process at a predetermined temperature for a certain time. For example, the heating process may be performed at a temperature of about 150° C. for 1 to 2 hours.

Figure 12A:
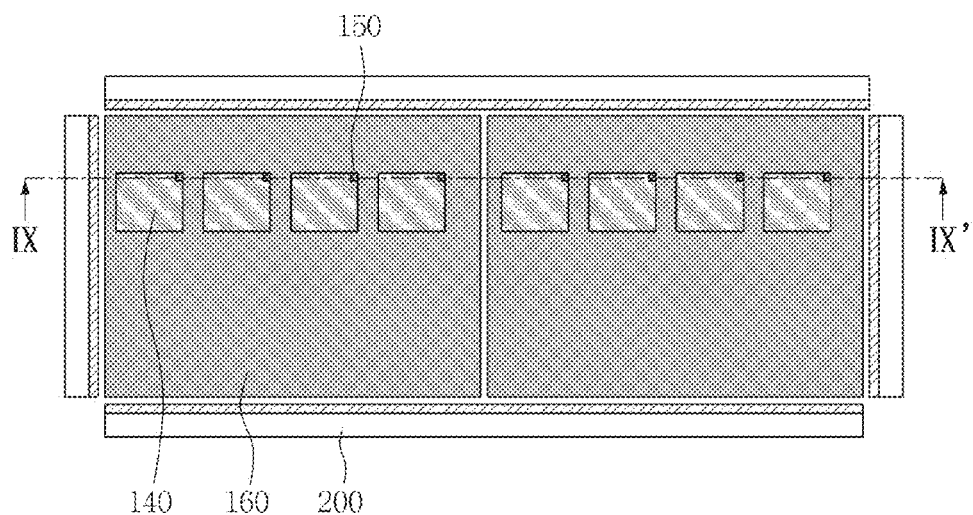
Figure 12B:
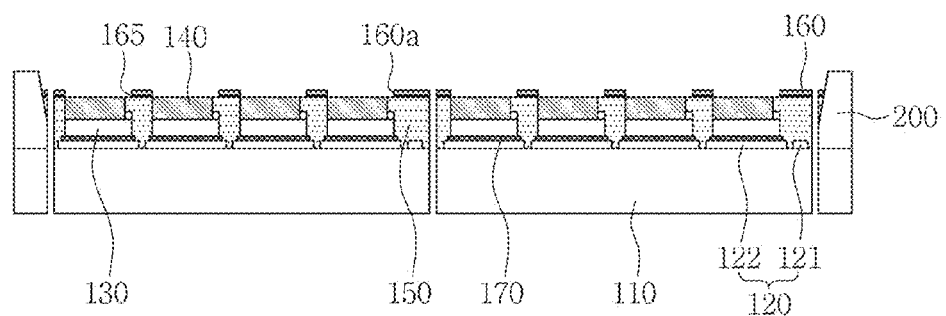

Referring to FIGS. 12A and 12B, the method may include removing the dam 200 and edges of the package substrate 110 on which the dam 200 is formed, by cutting and separating the dam 200 and the edges of the package substrate 110 on which the dam 200 is formed. The final LED package may be obtained by performing the above process.

The LED packages 100a to 100d shown in FIGS. 1A to 1F may be easily predicted and understood for each of the methods of manufacturing the LED packages when combining with various embodiments of the present disclosure described with reference to FIGS. 2A to 12B.

Figure 13:
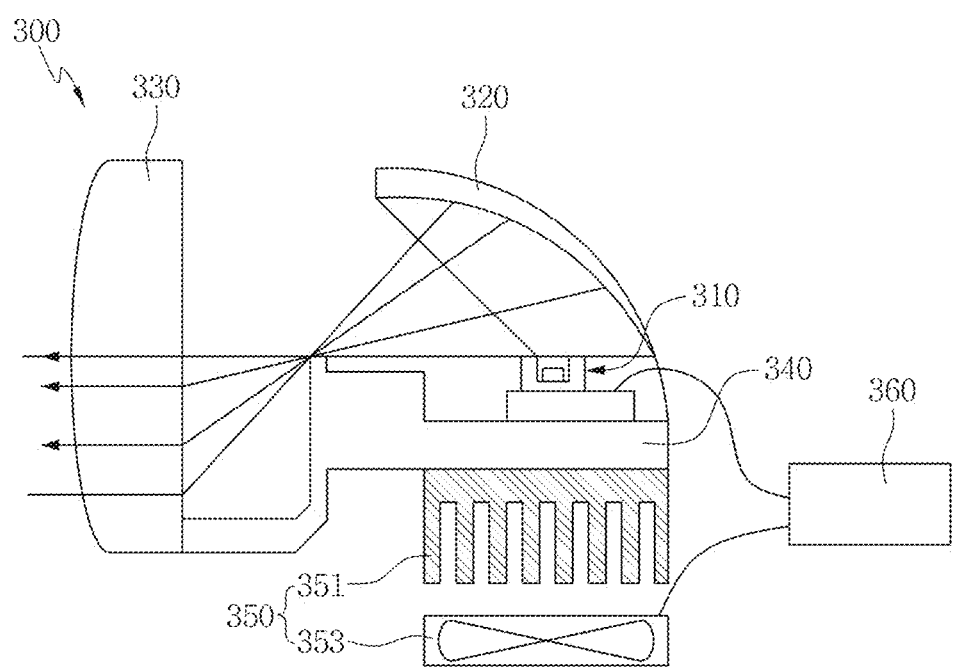
FIG. 13 is a conceptual view illustrating a vehicle headlamp module having at least one of the LED packages in accordance with various, exemplary embodiments of the present disclosure.

FIG. 13 is a conceptual view illustrating a vehicle headlamp module having at least one of the LED packages in accordance with various, exemplary embodiments of the present disclosure.

Referring to FIG. 13, a headlamp module 300 according to an exemplary embodiment of the present disclosure may include an LED package 310, a frame 340 configured to support the LED package 310, a reflector 320 configured to reflect light emitted from the LED package 310, an aspheric lens 330 configured to bend light reflected from the reflector 320 to a desired angle, a radiating module 350 including a radiator 351 on the bottom of the LED package 310 and a fan 353 configured to dissipate heat from the radiator 351, and a driving module 360 electrically connected to the LED package 310 and the fan 353 to control operations thereof.

The reflective layer 150 in the vicinity of phosphor layers 140 is covered by the mask 160 in the LED package 310, thereby preventing generation of a second reflection caused by exposing light to the top of the reflective layer 150 when light reflected from the reflector 320 and the aspheric lens 330 is returned to the LED package 310. Since an occurrence of the second reflection can be prevented, the quality of light of the vehicle headlamp module 300 can be improved by suppressing a non-uniform brightness distribution.

In accordance with various, exemplary embodiments of the present disclosure, the LED packages dispose a mask on the reflective layer and thus incident light on the reflective layer from the outside is prevented, thereby a quality of light can be improved by suppressing light spreading and increasing a contrast range. For example, light emitted through a phosphor layer from an LED chip in a headlamp module can be reflected in an LED chip direction by a reflector or lens. In this case, the mask blocks exposing light reflected from the reflector or lens to the reflective layer, and thus the light is not emitted from portions other than the phosphor layer. Therefore, the quality of light can be improved by increasing a contrast range between the phosphor layer portions and the other portions.

Other various effects are described in the above detailed descriptions.

The foregoing is illustrative of exemplary embodiments and is not to be construed as limiting thereof. Although a few embodiments have been described, those having ordinary skill in the art will readily appreciate that many modifications are possible without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:
1. An LED package, comprising:
a package substrate;
a first LED chip mounted on the package substrate;
a first phosphor layer disposed on the first LED chip;
a reflective layer configured to surround sides of the first LED chip and the first phosphor layer; and
a mask disposed on the reflective layer and including a first opening portion which exposes a surface of the first phosphor layer,
wherein at least one side of the first opening portion is adjacent to at least one edge of the first phosphor layer and extends parallel to the at least one edge of the first phosphor layer, and side surfaces of the reflective layer are vertically continuously aligned with side surfaces of the package substrate, and wherein at least a portion of the reflective layer is disposed on an upper surface of the first LED chip, and the first opening portion exposes the at least a portion of the reflective layer.

2. The LED package of claim 1, further comprising:
a second LED chip mounted on the package substrate to be spaced apart from the first LED chip; and
a second phosphor layer disposed on the second LED chip,
wherein the mask further includes a second opening portion which exposes a surface of the second phosphor layer.

3. The LED package of claim 2, wherein areas of the first opening portion and the second opening portion are the same as areas of the first phosphor layer and the second phosphor layer, respectively.

4. The LED package of claim 1, further comprising:
a second LED chip mounted on the package substrate to be spaced apart from the first LED chip; and
a second phosphor layer disposed on the second LED chip,
wherein the first opening portion exposes a surface of the first phosphor layer, a surface of the second phosphor layer, and a surface of the reflective layer disposed between the first phosphor layer and the second phosphor layer.

5. The LED package of claim 1, further comprising:
a first metal wiring and a second metal wiring disposed on the package substrate,
wherein the first LED chip is disposed on the second metal wiring.

6. The LED package of claim 5, further comprising a solder layer disposed on the second metal wiring.

7. The LED package of claim 6, wherein the first LED chip includes an electrode disposed on a lower surface thereof, and the electrode is electrically connected to the second metal wiring through the solder layer.

8. The LED package of claim 5, wherein the first LED chip includes an electrode disposed on an upper surface thereof, and the electrode is electrically connected to the first metal wiring through a wire.

9. The LED package of claim 8, wherein the electrode is not covered by the first phosphor layer but is covered by the reflective layer.

10. The LED package of claim 1, wherein the first phosphor layer includes a single layer having a substantially uniform thickness.

11. The LED package of claim 1, wherein the mask includes a metal plate having a black film formed by a black anodizing process.

12. The LED package of claim 1, further comprising an adhesive layer including silicon disposed between a surface of the reflective layer and the mask.

13. An LED package, comprising:
a package substrate;
a plurality of LED chips mounted on the package substrate to be arranged in a line;
a plurality of phosphor layers disposed on respective LED chips to vertically overlap the LED chips;
a reflective layer configured to surround sides of the LED chips and the phosphor layers; and
a mask disposed on the reflective layer to expose surfaces of the phosphor layers,
wherein at least one side of the mask is adjacent to at least one edge of each of the plurality of the phosphor layers and extends parallel to the at least one edge of each of the plurality of the phosphor layers, and side surfaces of the reflective layer are vertically continuously aligned with side surfaces of the package substrate, and
wherein top surfaces of the phosphor layers are coplanar with a top surface of the reflective layer.

14. The LED package of claim 13, wherein the mask includes a second plate extending in a horizontal direction adjacent to second sides of the LED chips opposite the first sides of the LED chips.

15. The LED package of claim 13, wherein the mask protrudes more than the top surfaces of the phosphor layers.

16. An LED package, comprising:
a package substrate;
an LED chip mounted on the package substrate;
a phosphor layer disposed on the LED chip;
a light reflecting layer disposed on at least one side surface of the LED chip; and
a light blocking layer disposed on the light reflecting layer such that at least a portion of the light reflecting layer is arranged between the light blocking layer and the package substrate in a thickness direction of the LED package and at least another portion of the light reflecting layer is not arranged between the light blocking layer and the package substrate in the thickness direction of the LED package,
wherein the light blocking layer includes an opening portion which exposes a surface of the phosphor layer, the opening portion has a rectangular shape, and at least one side of the opening portion is adjacent to at least one edge of the phosphor layer and extends parallel to the at least one edge of the phosphor layer, and
wherein a top surface of the phosphor layer is coplanar with a top surface of the light reflecting layer, and side surfaces of the light reflecting layer are vertically continuously aligned with side surfaces of the package substrate.

17. The LED package of claim 16, wherein the light blocking layer includes an opening which overlaps at least a portion of the LED chip in the thickness direction of the LED package.

18. The LED package of claim 17, wherein at least a portion of the light reflecting layer overlaps the opening in the thickness direction of the LED package.

19. The LED package of claim 16, further comprising a phosphor layer disposed on the LED chip.

20. The LED package of claim 19, wherein the light reflecting layer is disposed on at least one side surface of the phosphor layer.

* * * * *